(12) United States Patent  
Tanaka

(10) Patent No.: US 6,914,281 B2  
(45) Date of Patent: Jul. 5, 2005

(54) NONVOLATILE SEMICONDUCTOR STORAGE DEVICE

(75) Inventor: Masahiro Tanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/834,075

(22) Filed: Apr. 12, 2001

(65) Prior Publication Data

US 2002/0017675 A1 Feb. 14, 2002

(30) Foreign Application Priority Data

Apr. 12, 2000 (JP) ..................................... P2000-110139

(51) Int. Cl.⁷ .................... H01L 27/108; H01L 29/76; H01L 29/94; H01L 31/119
(52) U.S. Cl. ...................................... 257/295; 257/306
(58) Field of Search ................. 257/295–310; 438/3, 253, 255, 240–252

(56) References Cited

U.S. PATENT DOCUMENTS 5,932,904 A  * 8/1999 Hsu et al. ................ 257/295
6,438,019 B2 * 8/2002 Hartner et al. ............ 257/295
6,548,343 B1 * 4/2003 Summerfelt et al. ...... 438/240

* cited by examiner

*Primary Examiner*—Cuong Nguyen  
(74) *Attorney, Agent, or Firm*—Robert J. Depke; Trexler, Bushnell, Blackstone, Giangiorgi & Marr

(57) ABSTRACT

In order to provide a nonvolatile semiconductor storage device designed to take off such existing restraint on the degree of freedom of device design as needed for the purpose of securing design margin, thus realizing a ferroelectric, nonvolatile storage device of high integration density, there is disclosed a capacitor using a ferroelectric thin film is provided, so that the apparent coercive electric field value in the operational guaranteed margin temperature of the nonvolatile semiconductor storage device when regarded as the voltage applied to the capacitor remains within the range of design margin of the nonvolatile semiconductor storage device at the coercive electric field value at the specified temperature, in which a metal oxide of a layer structure having the ferroelectric-to-normal dielectric phase transition point of 800° C. or higher may be used for the ferroelectric thin film.

11 Claims, 12 Drawing Sheets

NONVOLATILE SEMICONDUCTOR STORAGE DEVICE

RELATED APPLICATION DATA

The present application claims priority to Japanese Application P2000-110139 filed Apr. 12, 2000, which application is incorporated herein by reference to the extent permitted by law.

BACKGROUND OF INVENTION

1. Field of the Invention

This invention relates to a nonvolatile semiconductor storage device, and more particularly, to a nonvolatile semiconductor storage device using a ferroelectric thin film.

2. Description of the Related Art

Various proposals and suggestions regarding the construction of nonvolatile semiconductor storage devices of high integration density in terms of use of ferroelectric thin films for semiconductor storage elements are known. In the currently available technology for designing or fabricating such nonvolatile storage devices, the quantity of change in the residual spontaneous polarization of the ferroelectric thin film within the operational guaranteed temperature of the coercive electric field serves as one of the criteria in determining design margin.

However, the existing method of securing the design margin entails a drawback well known to those active in the field, in that restraint of the freedom of device design is created, standing as an obstacle to the realization of storage devices of high integration.

SUMMARY OF THE INVENTION

It is therefore an object of the present invention to provide a nonvolatile semiconductor storage device of high integration density which can resolve the aforementioned disadvantage.

A nonvolatile semiconductor storage device according to the present invention comprises a nonvolatile semiconductor storage device provided with a capacitor using a ferroelectric thin film, wherein an apparent coercive electric field value in the operational guaranteed temperature range of the nonvolatile semiconductor storage device when regarded as the voltage applied to the capacitor remains within the range of design margin of the nonvolatile semiconductor storage device in the coercive electric field value at the specified temperature.

For example, when regarded in terms of the voltage applied to the aforementioned capacitor, the rate of change in the temperature of the apparent coercive electric field is 0.3%/° C. or lower in the operational guaranteed temperature range of the nonvolatile semiconductor storage device. Also, the design margin associated with the coercive electric field is lowered by constructing a complex capacitor structure for the capacitor, wherein a dielectric capacitor with a dielectric thin film having such a temperature dependency that the dielectric constant thereof decreases accompanying an increase in temperature over the operational guaranteed temperature range of the nonvolatile semiconductor storage device mentioned above is serially connected with a dielectric capacitor provided with a ferroelectric thin film.

In the nonvolatile semiconductor storage device mentioned above, changes of the coercive electric field in the operational guaranteed temperature are kept down to a minimum, so that the design margin of a nonvolatile storage device element becomes small, thus realizing a ferroelectric, nonvolatile storage device of high integration density.

The coercive electric field of a ferroelectric typically decreases in proportion to the power of 1.5 of (T−Tc), where T denotes the sample temperature T and Tc denotes the ferroelectric phase transition temperature. Consequently, for instance, assume that the change of the coercive electric field accompanying a temperature increase from the room temperature to 80° C. needs to be suppressed to 10% or less. Then, it would be necessary for Tc to exceed approx. 800° C. This means that the selection of materials for a ferroelectric thin film is likely to turn out substances such as $LiNbO_3$ (Tc=1483K), and $La_2Ti_2O_7$ (Tc=1773K), $Nd_2Ti_2O_7$ (Tc=1773K), and $Sr_2Nb_2O_7$ (Tc=1615K) which have a structure of $Sr_2Nb_2O_7$, and $Bi_2WO_6$ (Tc=1208K), $Bi_3TiNbO_9$ (TC=1213K), and $Bi_3TiTaO_9$ (Tc=1143K) which have a layer structure.

Moreover, in the above mentioned nonvolatile semiconductor storage device, the design margin associated with the coercive electric field decreases through construction of a complex capacitor structure for the capacitor, thereby resulting in diminishing the design margin of a nonvolatile storage element using a ferroelectric and realizing a ferroelectric nonvolatile storage device of high integration density.

The above-mentioned complex capacitor is, for example, a ferroelectric capacitor serially connected with a capacitor (compensation capacitor) using a dielectric thin film having such a temperature dependency that the dielectric constant thereof tends to decrease accompanying the increase in the temperature of a material. In such a complex capacitor, compensation for the temperature dependency of the coercive electric field is performed by reducing the voltage to be applied to the ferroelectric capacitor accompanying the increase in the capacitor temperature.

For materials of the compensation capacitor which can compensate for the temperature dependency of the coercive electric field, there are available, for instance, $Pb(M_{1/3}Nb_{2/3})O_3$ (where M=Co, Ni, Mg), $Pb(M_{1/3}Ta_{2/3})O_3$ (where M=Co, Ni, Mg), and $Pb(Fe_{2/3}W_{1/3})O_3$, wherein position B of a ferroelectric having the Perovskite structure ($ABO_3$) is composed of a mixture of two kinds of elements. In these materials, a phase change from normal dielectric phase to ferroelectric phase occurs in the vicinity of 180K to 80K, which is sufficiently lower than the operational guaranteed temperature of a device (e.g., −40° C.), at which they have no spontaneous polarization, showing characteristics as the dielectrics of high dielectric constants.

Further, voltage applied to the complex capacitor is distributed to the ferroelectric capacitor and the compensation capacitor. The voltage thus distributed to the compensation capacitor is determined in terms of a balance between the effective performance of compensation and suppression of the operating voltage of the device as a result of distribution of no excessive.

Take, for instance, a case of using an SBT thin film for the ferroelectric capacitor. If the compensation capacitor should take the same shape as that of the ferroelectric capacitor, a dielectric constant of about 500 or more is necessary for the voltage associated with the compensation capacitor to be about 0.5 times that of the SBT. Also, in a case of using a PZT film for the ferroelectric capacitor, it is desirable to use a substance of even higher dielectric constant for the thin film material of the compensation capacitor.

As the foregoing explanation shows, the present invention provides a nonvolatile semiconductor storage device in which the design margin associated with the coercive electric field of the nonvolatile semiconductor storage device can be reduced by keeping any change in the operational guaranteed temperature of the coercive electric field down to a minimum. Inasmuch as this reduction makes it possible to diminish the design margin of a nonvolatile semiconductor storage device of high integration density, a ferroelectric nonvolatile semiconductor storage device subjected to a more rigorous criterion of design margin, namely, a ferroelectric nonvolatile storage device of high integration density, can be realized.

Other objects and features of the present invention will appear in the course of the description thereof which follows.

DETAILED DESCRIPTION OF THE PREFERRED EMBODIMENTS

Preferred embodiments of this invention will now be described with reference to the accompanying drawings. Through proper selection of the material for the ferroelectric thin film so as to minimize changes in the operational guaranteed temperature of the coercive electric field, the design margin of the nonvolatile storage element using the ferroelectric thin film is made small to materialize the ferroelectric nonvolatile storage device of high integration density.

First Embodiment

A nonvolatile semiconductor storage device according to a first embodiment of the present invention will now be explained with reference to a schematic cross-sectional view of FIG. 1.

Figure 1:
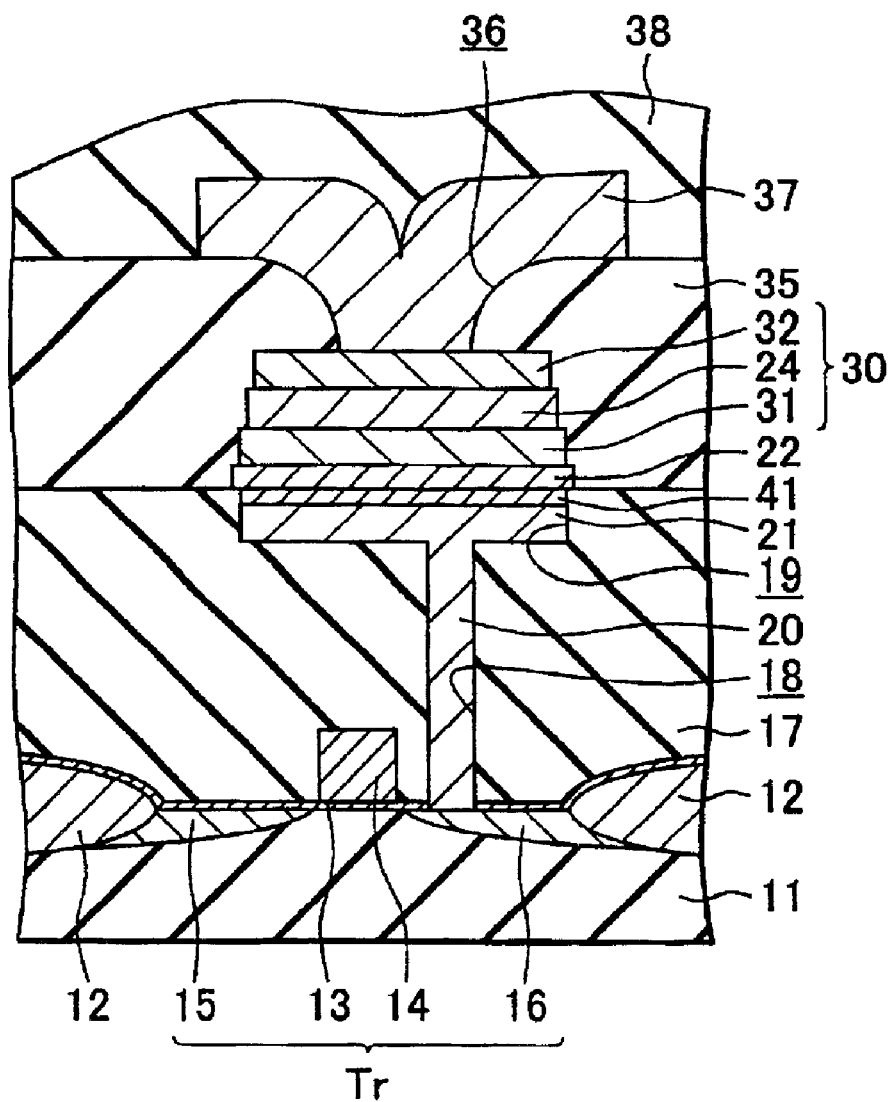
FIG. 1 shows schematically a section of a first preferred embodiment of a nonvolatile semiconductor storage device according to the present invention.

As shown in FIG. 1, an element isolation oxide film 12 separating an element forming region is formed on a semiconductor substrate 11 (e.g., p-type silicon substrate). On the element forming region of the semiconductor substrate 11 is formed a gate insulating film 13 comprising a silicon oxide film of 1.5 nm thick, for example, and a silicon nitride film of 2 nm thick, for example.

On the above-mentioned gate insulating film 13 is formed a gate electrode 14. Further, a source region 15 is formed on one side of the gate electrode 14 on the semiconductor substrate 11, while a drain region 16 is formed on the other side thereof on the semiconductor substrate 11. A transistor Tr is constructed in this manner.

On the substrate 11, a first interlayer insulating film 17 covering the transistor Tr is deposited and formed, for instance, by depositing the silicon oxide film of 700 nm thick. In this first interlayer insulating film 17 are formed a contact hole 18 extending to the drain region 16 and a connection pattern groove 19 stretching out continuously to the contact hole 18, in which a plug 20 comprised of polysilicon is formed, while inside the connection pattern groove 19 is formed a conductive pattern 21 composed of polysilicon. As shown in the figure, a silicide layer 41 may be formed on top of the conductive pattern 21.

On the first interlayer insulating film 17 is formed a barrier layer 22 connecting with the conductive pattern 21. This barrier layer 22 comprises, as an example, a titanium (Ti) film fully grown to a thickness of 20 nm and a titanium nitride (TiN) thin film fully grown to a thickness of 50 nm thereon.

On the barrier layer 22 is formed a lower electrode 31 comprising a platinum thin film of 200 nm thick, for example. Also, on the lower electrode 31 is formed a ferroelectric thin film 24 comprising a $Bi_3TiTaO_9$ thin film having a thickness of 80 nm to 120 nm, for example. Furthermore, on the ferroelectric thin film 24 is formed an upper electrode 32 comprising a platinum thin film. As described above, the capacitor 30 is comprised of the lower electrode 31, the ferroelectric thin film 24, and the upper electrode 32.

Insofar as the ferroelectric thin film 24 is a metal oxide having a layer structure or a metal oxide having an $Sr_2Nb_2O_7$ structure as the metallic oxide with the phase transition point from ferroelectric to normal dielectric of 800° C. or higher, it is not limited to $Bi_3TiTaO_9$.

Moreover, a second interlayer insulating film 35 is formed through deposition of a silicon oxide film with a thickness of 200 nm, for example, in the manner of covering the aforementioned capacitor 30. On this second interlayer insulating film 35 is formed a connection aperture 36 extending to the upper electrode 32, and a wiring 37 connecting with the upper electrode 32 via the connection aperture 36 is formed on the second interlayer insulating film 35, a protective film 38 covering the wiring 37 being further formed thereon with a pad (not shown) formed on the protective film 38.

Normally, the coercive electric field of a ferroelectric decreases in proportion to the power of 1.5 of (T−Tc), where the sample temperature is T and the ferroelectric phase transition temperature is Tc. Consequently, suppose that the change of the coercive electric field accompanying a temperature increase from the room temperature to 80° C. is to be suppressed to 10% or less. Then Tc needs to be approx. 800° C. or higher. This means that the selection of materials for a ferroelectric thin film would present candidates such as $LiNbO_3$ (Tc=1483K), and $La_2Ti_2O_7$ (Tc=1773K), $Nd_2Ti_2O_7$ (Tc=1773K), and $Sr_2Nb_2O_7$ (Tc=1615K) which have a structure of $Sr_2Nb_2O_7$, and $Bi_2WO_6$ (Tc=1208K), $Bi_3TiNbO_9$ (TC=1213K), and $Bi_3TiTaO_9$ (Tc=1143K) which have a layer structure.

In addition, when such factors as the rate of change in the temperature of the apparent coercive electric field to be 0.3%/° C. or less in the operational guaranteed temperature range of the nonvolatile semiconductor storage device, the ease of crystallization, and the possibility of obtaining large spontaneous polarization are all taken into consideration, it is preferable to use $Bi_3TiNbO_9$ or $Bi_3TiTaO_9$ as the ferroelectric material of a capacitor.

Hence, in the nonvolatile semiconductor storage device of the foregoing first preferred embodiment, $Bi_3TiTaO_9$ is used as the ferroelectric material of the capacitor. Any change in the coercive electric field accompanying an increase in the temperature of the ferroelectric (an increase from the room temperature of 25° C. to 80° C., for example) can thus be suppressed to 10% or less. Accordingly, the design margin of a nonvolatile storage device becomes small, thus making it possible to bring about a ferroelectric, nonvolatile storage device of high integration density.

Now referring to sectional views of the fabrication process from FIGS. 2A to 2E, a method of fabricating the nonvolatile semiconductor storage device described in the preceding first preferred embodiment will be explained.

Figure 2A:
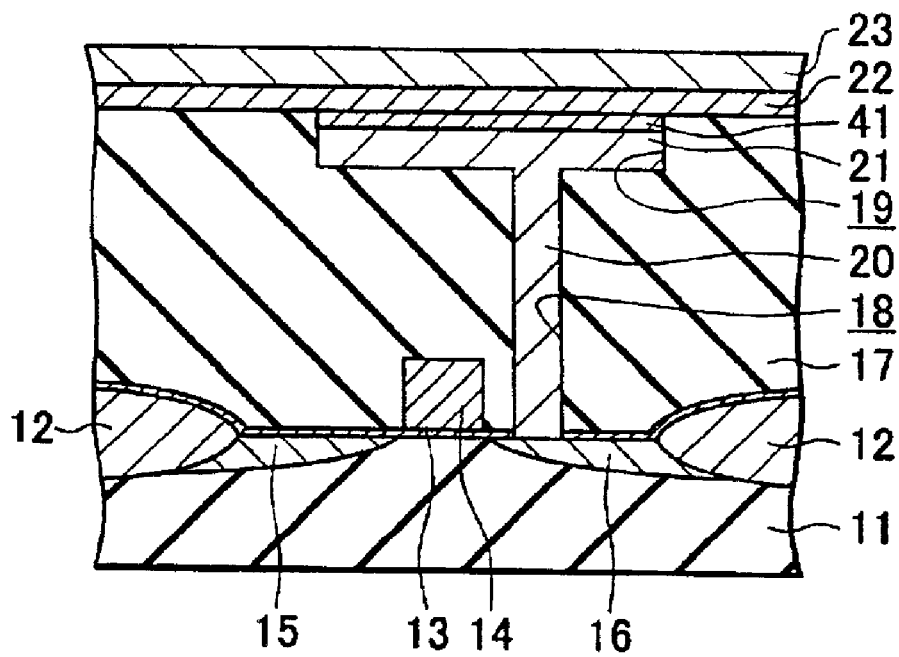
FIGS. 2A to 2E are cross-sectional views of a fabrication process illustrating a fabrication method of a nonvolatile semiconductor storage device described in a first preferred embodiment.

As FIG. 2A shows, after the element isolation oxide film 12 is formed on the semiconductor substrate 11 (for example, p-type silicon substrate) by the selective oxidation process, the semiconductor substrate 11 is heated to 800° C. and subjected to exposure to oxygen gas diluted with nitrogen gas, a silicon oxide film of 1.5 nm thick, for example, is formed on the exposed surface of the semiconductor substrate 11. Further processing by reduced pressure CVD forms a silicon nitride of 2 nm thick, for example, to be used as the gate insulation film 13.

The subsequent step includes the formation of an electrode forming film by producing a gate electrode thin film and a titanium nitride thin film. This is followed by forming a photoresist film (not shown) by the coating technique, whereafter the photoresist film is subjected to patterning into the shape of a gate electrode pattern by the lithographic process (exposure, development, baking, etc.), the patterned photoresist film being next employed as a mask for etching the electrode forming film to form the gate electrode 14. Further, impurity (e.g., arsenic) is introduced into the semiconductor substrate 11 by ion implantation using the photoresist film and the element isolation oxide film 12 as the masks to form the source region 15 and the drain region 16. The photoresist film is then stripped.

The succeeding step entails the formation of the first interlayer insulation film 17 through the deposition step of a silicon oxide film of 700 nm thick, for example, on the semiconductor substrate 11 by CVD, while the substrate temperature at the time of film making for the first interlayer insulation film 17 was set at 400° C., for example. This is followed by the step of forming the contact hole 18 which exposes the drain region 16 and the connection pattern groove 19 which stretches out continuously to the contact hole 18.

Then, after polysilicon is deposited with a thickness of 600 nm, for example, in the manner of embedding it inside the contact hole 18 and the connection pattern groove 19, it is subjected to the heat treatment in nitrogen at 850° C. for 30 minutes, for example. Thereafter, an excess polysilicon film on the first interlayer insulating film 17 is removed, e.g., by CMP (Chemical Mechanical Polishing) to produce the plug 20 inside the contact hole 18 as well as the conductive pattern 21 inside the connection pattern groove 19. Note that, as shown in the figure, to improve the conductivity of the conductive pattern 21, silicide processing may be applied to the top of the conductive pattern 21 to form the silicide layer 41.

The subsequent step includes rinsing of the semiconductor substrate 11, which is then heated or exposed to an atmosphere under reduced pressure for dehydration, whereupon a process such as sputtering takes over to produce a titanium (Ti) thin film (not shown) of 20 nm thick, for example, then a titanium nitride (TiN) thin film of 50 nm thick, for example, thereby forming the barrier layer 22. Next, a lower electrode thin film 23 comprised of a platinum (Pt) film is produced with a thickness of 200 nm, for example.

As an example of the foregoing film making conditions of each film, the substrate temperature may be set at 200° C., for example, when making a titanium (Ti) thin film, 25° C., for example, when making a titanium nitride (TiN) thin film, or 400° C., for example, when making a platinum thin film. The pressure of film-making atmosphere in any of these cases may be set at 0.53 Pa with DC power at 2 kW. Each of the above-mentioned films is heat-treated for 1 hour in a nitrogen atmosphere of 400° C. to 700° C., as necessary, to form the stable lower electrode thin film 23.

Figure 2B:
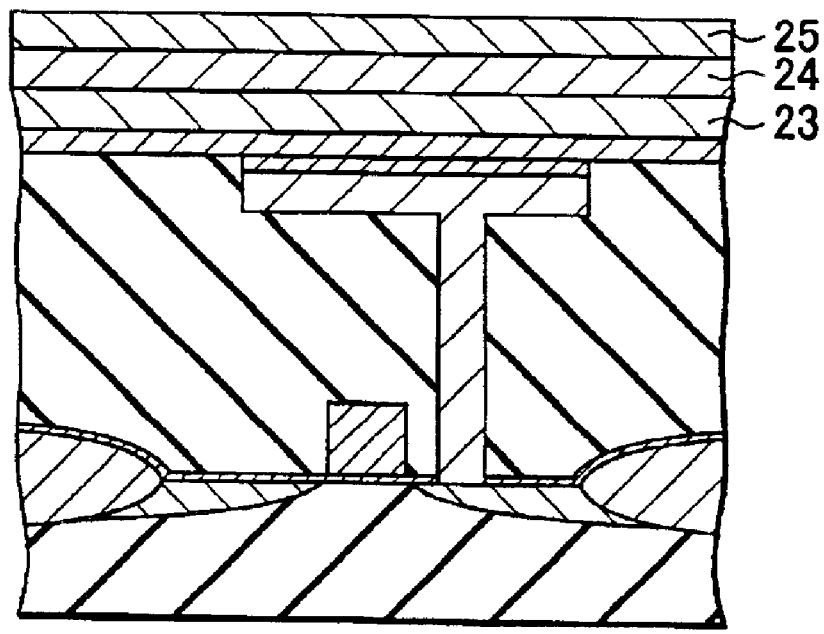

As shown in FIG. 2B, the rotary coating method follows to make a $Bi_3TiTaO_9$ precursor thin film. First, the elements of Bi, Ti, and Nb are compared to the stoichiometric composition of $Bi_3TiTaO_9$, and on the aforementioned semiconductor substrate 11 which was subjected to all the processing steps up to and including the formation of the lower electrode thin film 23 thereon, a series of processing steps of coating a solution of organic metals containing a 1% to 1.5% excess of Bi, drying, and rapid thermal annealing (RTA) are performed one time or several times, whereupon, as necessary, an oxidation processing using ozone is performed at lower temperatures under 500° C. to form a precursor (oxide) thin film.

The precursor (oxide) thin film next undergoes the crystallization process in an oxidative or neutral atmosphere at the specified temperature between 500° C. and 750° C., thereby forming a ferroelectric thin film 24 comprising a $Bi_3TiTaO_9$, thin film of a thickness of 80 nm to 120 nm the lower electrode thin film.

Insofar as the ferroelectric thin film 24 is a metallic oxide having a layer structure or an $Sr_2Nb_2O_7$ structure as the metallic oxide with its phase transition point from ferroelectric to normal dielectric of over 800° C., it is not limited to $Bi_3TiNbO_9$.

Subsequently, the upper electrode thin film 25 comprised of a platinum thin film mentioned above is formed on the ferroelectric thin film 24 by sputtering. As an example of the film-making conditions of this platinum thin film, the following settings may be used: the specified temperature between 25° C. and 400° C. for the substrate temperature, 0.53 Pa for the pressure of film-making atmosphere, and 2 kW for DC power. The heat treatment may be performed, as necessary, in a nitrogen atmosphere at 550° C. to 700° C. or in a mixed atmosphere of oxygen and nitrogen for 30 minutes to 1 hour, thereby improving the crystallinity of the ferroelectric thin film 24 and the upper electrode thin film 25.

Figure 2C:
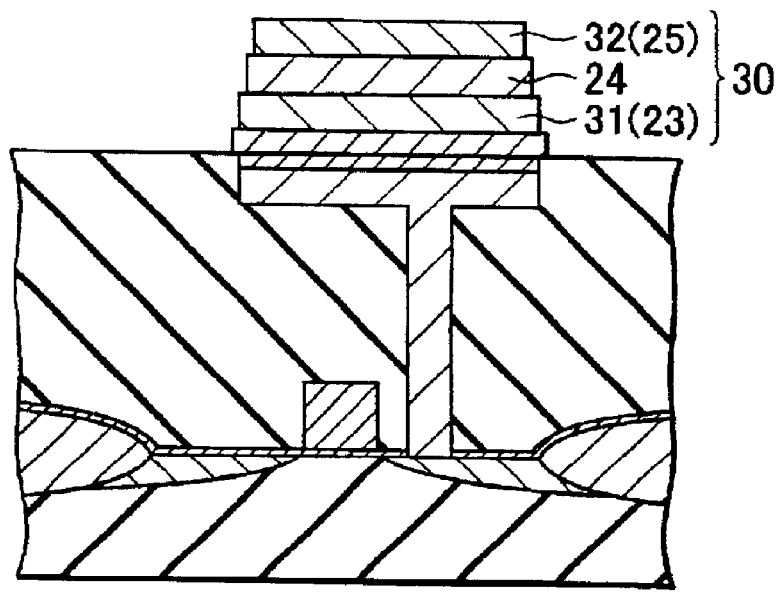

As shown in FIG. 2C, after the formation of a photoresist film (not shown) by the coating technique on the upper electrode thin film 25, the photoresist film is patterned by the lithographic process (exposure, development, baking, etc.) into the shape of a capacitor pattern. Then, the patterned photoresist film is used as a mask for etching from the upper electrode thin film 25 to the barrier layer 22 so as to form the capacitor 30 comprising the lower electrode 31 comprised of the lower electrode thin film 23 and the upper electrode 32 comprised of the ferroelectric thin film 24 and the upper electrode thin film 25. The photoresist film is then removed.

It should be pointed out that a hard mask may be used instead of the photoresist film. After the removal of the mask film, as necessary, the heat treatment may be performed in nitrogen atmosphere or a mixed atmosphere of oxygen and nitrogen at 550° C. to 700° C. for 30 minutes to 1 hour, thereby improving the crystallinity of the ferroelectric thin film 24.

Figure 2D:
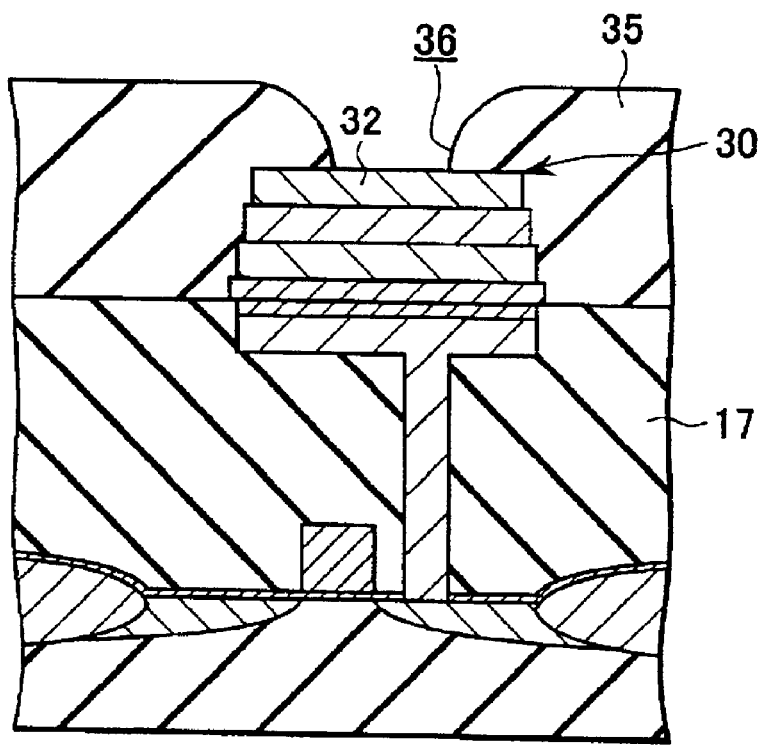

Referring next to the drawing in FIG. 2D, a silicon oxide film is deposited by CVD with a thickness of 200 nm, for example, in the manner of covering the capacitor 30, forming the second interlayer insulating film 35 on the first interlayer insulating film 17. The substrate temperature when making film for the second interlayer insulating film 35 was set at 400° C., for example.

Thereafter, after a photoresist film (not shown) is formed by the coating technique on the second interlayer insulating film 35, an opening pattern to form a connection aperture extending to the upper electrode 32 of the capacitor 30 is formed by the lithographic process (exposure, development, baking, etc.), followed by a dry etching process of the second interlayer insulating film 35 using the patterned photoresist film as a mask for forming the connection aperture 36 extending to the upper electrode 32. The photoresist film is then stripped.

Figure 2E:
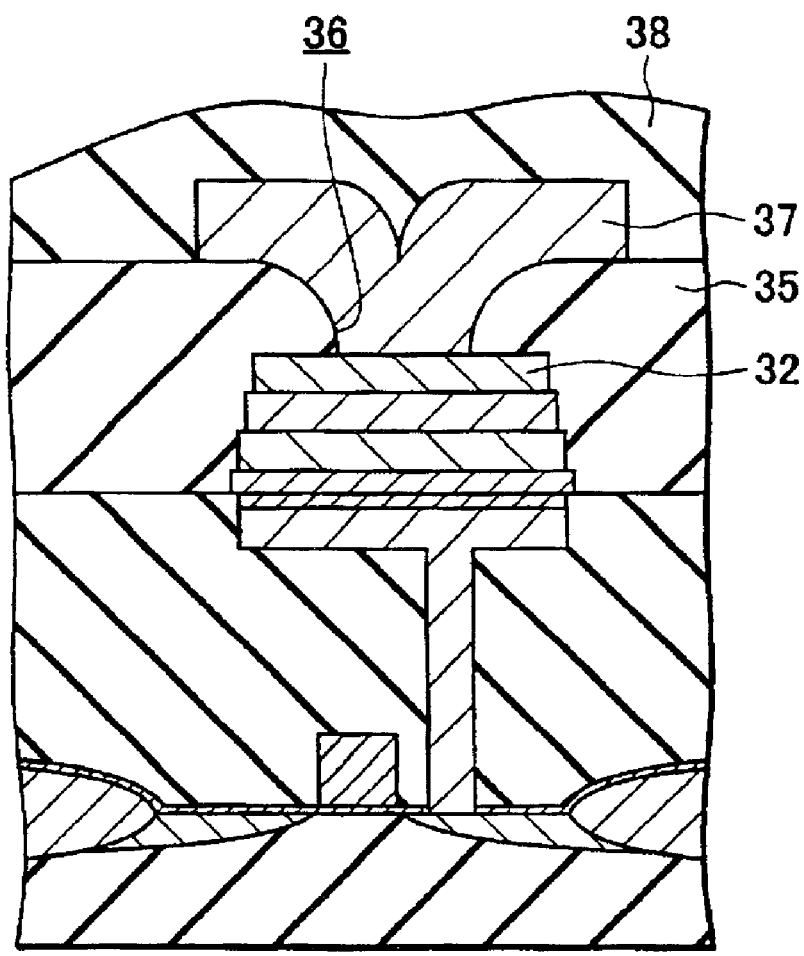

As illustrated in FIG. 2E, after a wiring metal film is formed on the second interlayer insulating film 35 in the manner of embedding the preceding connection aperture 36 by depositing aluminum or aluminum alloy, for example, the wiring metal film is subjected to patterning to form the wiring 37 connecting the connection aperture 36 with the upper electrode 32.

The protective film 38 covering the wiring 37 on the second interlayer insulating film 35 is next formed of such an insulating film containing a silicon nitride film, and there follows a step, not illustrated, of coating a photoresist, which is subjected to patterning by the lithographic process (exposure, development, baking, etc.) in the shape of a pad to take out wiring, whereupon this photoresist pattern is used as the mask to perform dry etching of the protective film 38, thus forming the pad (not shown).

Second Embodiment

Now, referring to a schematic cross-sectional view of FIG. 3, a modified nonvolatile semiconductor storage device according to a second embodiment will be described with an explanation of a nonvolatile semiconductor storage device using $Bi_3TiNbO_9$ as the ferroelectric material of a capacitor.

Figure 3:
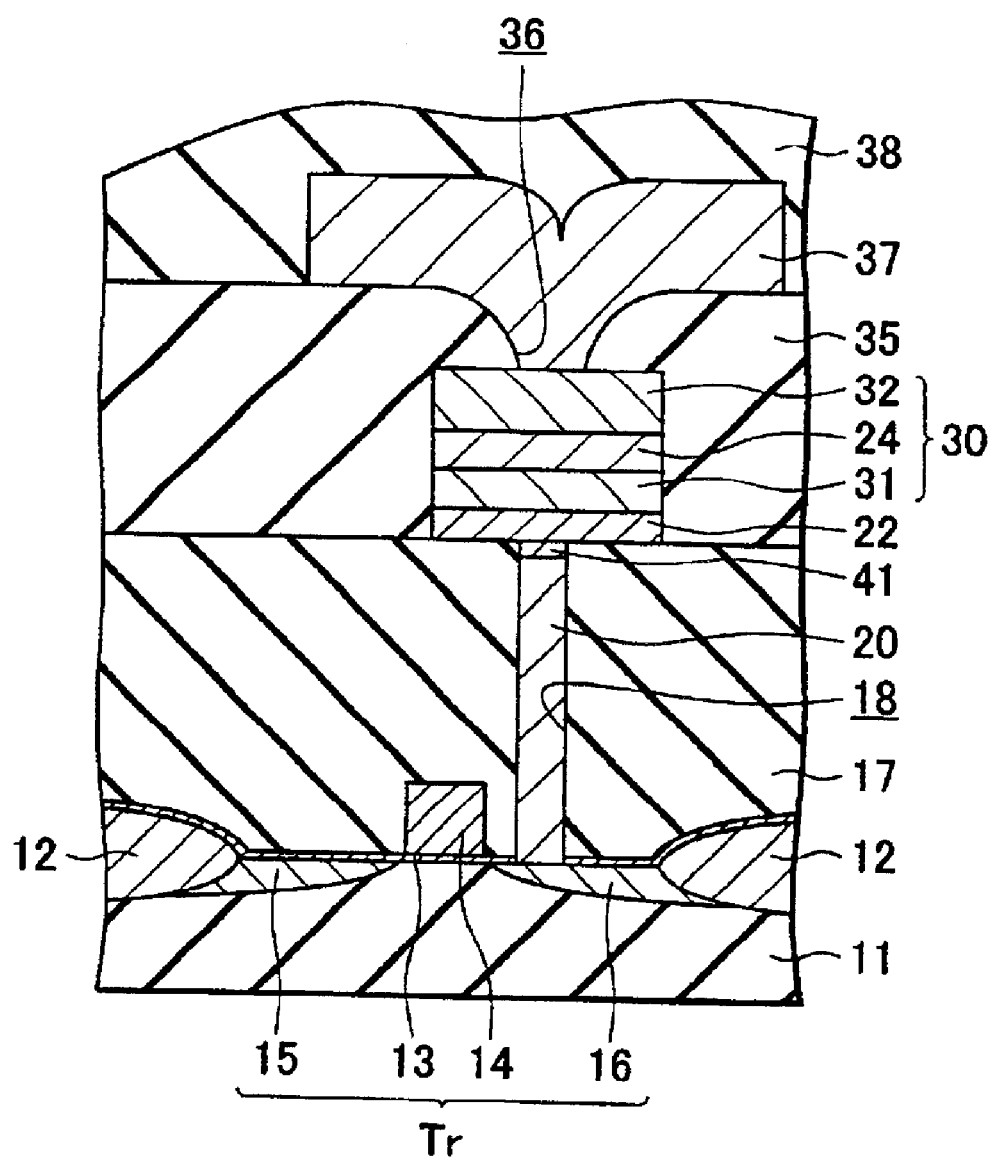
FIG. 3 shows schematically a section of a second preferred embodiment of a nonvolatile semiconductor storage device according to the present invention.

As shown in FIG. 3, an element isolation oxide film 12 separating an element forming region is formed on a semiconductor substrate 11 (e.g., p-type silicon substrate). In the element forming region of the semiconductor substrate 11 is formed a gate insulating film 13 comprising a silicon oxide film of a thickness of 1.5 nm, for example, and a silicon nitride film of a thickness of 2 nm, for example.

A gate electrode 14 is formed on the gate insulating film 13. In addition, a source region 15 is formed on one side of a gate electrode 14 on the semiconductor substrate 11, while a drain region 16 is formed on the other side thereof on the semiconductor substrate 11. A transistor Tr is constructed in this manner.

On the semiconductor substrate 11 is formed a first interlayer insulating film 17 covering the transistor Tr through the steps of deposition and formation of, for example, a silicon oxide film of a thickness of 700 nm, for example. On this first interlayer insulating film 17 is formed the contact hole 18 extending to the drain region 16. A plug 20 composed of polysilicon is formed inside the contact hole 18. As shown in the figure, a silicide layer 41 may be formed on top of the plug 20.

On the semiconductor substrate 11 is formed a barrier layer 22 connecting with the plug 20, the barrier layer 22 comprising, as an example, a titanium nitride film grown to a thickness of 20 nm and an iridium (Ir) thin film grown to a thickness of 50 nm thereon. In addition, on the barrier layer 22 is formed the lower electrode 31 comprising the platinum (Pt) thin film of a thickness of, e.g., 200 nm.

A ferroelectric thin film 24 comprising, for example, a $Bi_3TiNbO_9$ thin film of a thickness of 80 nm to 120 nm is formed on the lower electrode 31. Insofar as the ferroelectric thin film 24 is a metal oxide having a layer structure or a metal oxide having an $Sr_2Nb_2O_7$ structure as the metal oxide with its phase transition point from ferroelectric to normal dielectric of 800° C. or higher, it is not limited to $Bi_3TiNbO_9$.

Further, on the ferroelectric thin film 24 is formed an upper electrode thin film 25 comprising the iridium thin film. As described above, a capacitor 30 comprises the lower electrode 31, the ferroelectric thin film 24, and an upper electrode 32.

Still further, a second interlayer insulating film 35 is formed through the deposition of a silicon oxide film with a thickness of, e.g., 200 nm, in the manner of covering the capacitor 30. On this second interlayer insulating film 35 is formed the connection aperture 36 extending to the upper electrode 32. On the second interlayer insulating film 35 is formed a wiring 37 made of, e.g., aluminum or aluminum alloy, connecting with the upper electrode 32 via the connection aperture 36. On the interlayer insulating film 35 is formed a protective film 38 which covers the wiring 37, and the pad (not shown) is formed on the protective film 38.

Accordingly, in the nonvolatile semiconductor storage device according to the second embodiment, $Bi_3TiNbO_9$ is used as the ferroelectric substance of the capacitor material, so that any change in the coercive electric field accompanying a temperature increase of the ferroelectric material (e.g., from the room temperature of 25° C. to 80° C.) may be suppressed to under 10%, thus reducing the design margin of the nonvolatile semiconductor storage device and realizing a ferroelectric nonvolatile storage device of high integration density.

Next, a method of fabricating the nonvolatile semiconductor storage device which was explained in the aforementioned second embodiment will be described with reference to the cross-sectional views of the fabrication process from FIG. 4A to FIG. 4E.

Figure 4A:
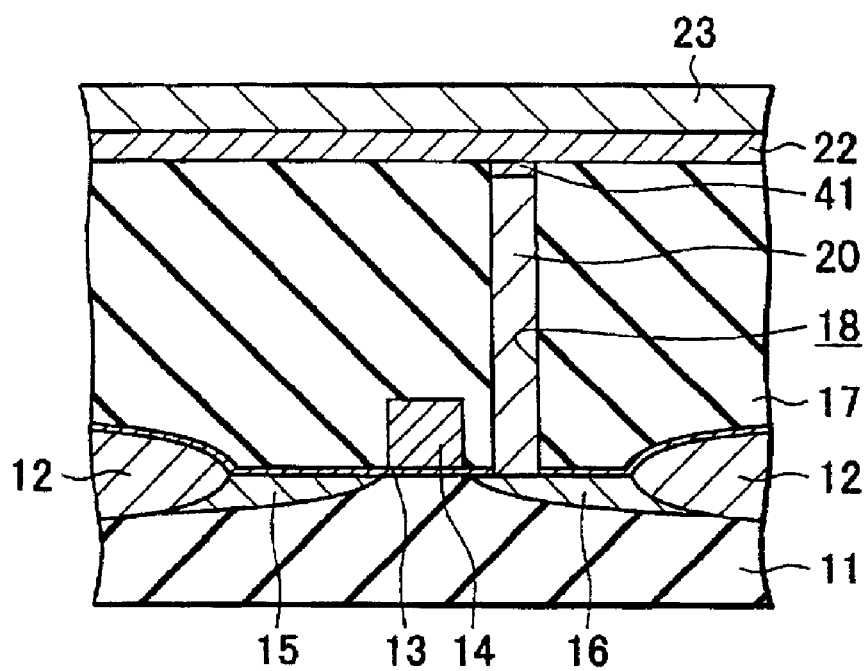
FIGS. 4A to 4E are cross-sectional views of a fabrication process illustrating a fabrication method of a nonvolatile semiconductor storage device described in a second preferred embodiment.

As FIG. 4A shows, after the element isolation oxide film 12 is formed on the semiconductor substrate 11 (e.g., p-type silicon substrate) by the selective oxidation process, the semiconductor substrate 11 is heated to 800° C. and subjected to exposure to oxygen gas diluted with nitrogen gas, a silicon oxide film of 1.5 nm thick, for example, is formed on the exposed surface of the semiconductor substrate 11. Further processing by reduced pressure CVD forms a silicon nitride film of 2 nm thick, for example, which serves as the gate insulating film 13.

After the next step of forming an electrode forming film by producing a gate electrode thin film and a titanium nitride thin film, a photoresist film (not shown) is formed by the coating technique, whereupon the photoresist film is subjected to patterning into the shape of a gate electrode pattern by the lithographic process (exposure, development, baking, etc.). Then, the patterned photoresist film is used as a mask for etching the electrode forming film to form the gate electrode 14. The next step is an introduction of impurity (e.g., arsenic) into the semiconductor substrate 11 by ion implantation using the photoresist film and the element isolation oxide film 12 as the masks to form the source region 15 and the drain region 16. After this process comes the stripping of the photoresist film.

The succeeding step involves the use of CVD to form the first interlayer insulating film 17 through the deposition of a silicon oxide film of 700 nm thick, for example, on the semiconductor substrate 11. The substrate temperature in film making for the first interlayer insulating film 17 is set at 400° C., for example. Thereafter, the formation of the contact hole 18 which exposes the drain region 16 follows.

In addition, after the deposition step of polysilicon with a thickness of 600 nm, for example, in the manner of embedding it inside the contact hole 18, it is subjected to the heat treatment in nitrogen at 850° C. for 30 minutes, for example. Then, an excess polysilicon film on the first interlayer insulating film 17 is removed by CMP (Chemical Mechanical Polishing) to produce the plug 20 inside the contact hole 18, for example. It should be noted that to improve the conductivity of the plug 20, silicide processing may be applied on an upper surface of the plug 20 for the formation of the silicide layer 41.

This is succeeded by the rinsing step of the semiconductor substrate 11 which is then heated or exposed to a reduced pressure atmosphere for dehydration. Then, a processing step such as sputtering takes over to produce a titanium (Ti) thin film of 20 nm thick, for example, then an iridium (Ir) thin film of 50 nm thick, for example, thereby forming the barrier layer 22. Next, the lower electrode thin film 23 comprised of a platinum (Pt) thin film is produced with a thickness of, e.g., 200 nm.

As an example of the foregoing film-forming conditions of each film, the substrate temperature may be set at 25° C., for example, when making a titanium nitride (TiN) thin film, 400° C., for example, when making an iridium (Ir) thin film 22, or 400° C., for example, when making a platinum (Pt) thin film 23, the pressure of film-making atmosphere in any of these cases being set at 0.53 Pa with DC power at 2 kW, while each of the aforementioned thin films is heat-treated for one hour in a mixed atmosphere of oxygen and nitrogen at 400° C. to 700° C., as necessary, to form the stable lower electrode thin film 23.

Figure 4B:
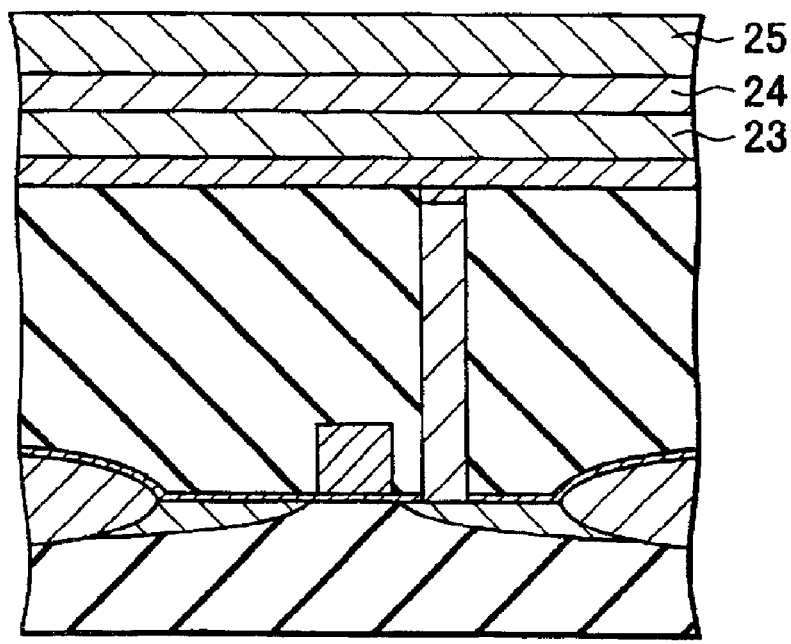

As shown in FIG. 4B, the rotary coating method follows to make a $Bi_3TiNbO_9$ precursor thin film. First, the elements of Bi, Ti, and Nb are compared to the stoichiometric composition of $Bi_3TiNbO_9$; and on the semiconductor substrate 11 which underwent all the steps up to and including the formation of the lower electrode thin film 23, a series of processing steps of coating a solution of organic metals containing a 1% to 1.5% excess of Bi, drying, and rapid thermal annealing (RTA) are performed one time or several times, and, as necessary, oxidation processing using ozone is conducted at low temperatures 500° C. or lower to form a precursor (oxide) thin film. The precursor (oxide) thin film is then processed with oxidation in an oxidative or neutral atmosphere at the specified temperature between 500° C. and 750° C., resulting in the formation of a ferroelectric thin film 24 comprising a $Bi_3TiNbO_9$ thin film of a thickness of 80 nm to 120 nm thereon.

Insofar as the ferroelectric thin film 24 is a metal oxide having a layer structure or a $Sr_2Nb_2O_7$ structure as the metallic oxide with its phase transition point from ferroelectric to normal dielectric of 800° C. or higher, it is not limited to $Bi_3TiNbO_9$.

Subsequently, the upper electrode thin film 25 comprised of an iridium thin film is formed on the ferroelectric thin film 24 by sputtering. As an example of film-making conditions of this iridium thin film, the specified temperature between 25° C. and 400° C. may be set for the substrate temperature with 0.53 Pa for the pressure of film-making argon atmosphere and 2 kW for DC power, for example. The heat treatment may be performed, as necessary, in nitrogen atmosphere or a mixed atmosphere of oxygen and nitrogen at 550° C. to 700° C. for 30 minutes to 1 hour, thereby improving the crystallinity of the ferroelectric thin film 24 and the iridium thin film.

Figure 4C:
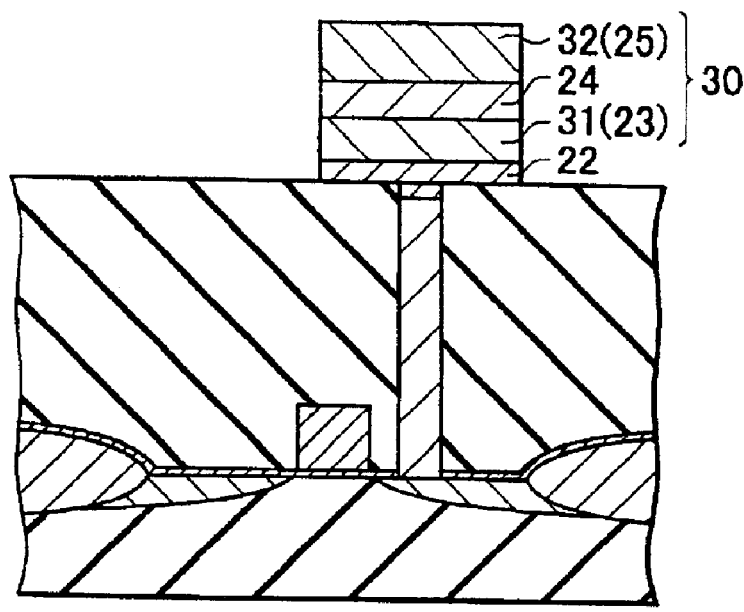

As illustrated in FIG. 4C, after the formation of a photoresist film (not shown) by the coating technique on the upper electrode thin film 25 comprised of the iridium thin film, the photoresist film is patterned by the lithographic process (exposure, development, baking, etc.) into the shape of a capacitor pattern. Then, the patterned photoresist film is used as a mask for etching from the aforementioned upper electrode thin film 25 to the barrier layer 22, thus forming a capacitor 30 comprising the lower electrode 31 which is comprised of the lower electrode thin film 23 and the upper electrode 32 which is comprised of the ferroelectric thin film 24 and the upper electrode thin film 25. The process of stripping the photoresist film follows.

It should be pointed out that a hard mask may be used instead of the photoresist film. After the removal of the mask film, as necessary, the heat treatment may be conducted in nitrogen atmosphere or a mixed atmosphere of oxygen and nitrogen at 550° C. to 700° C. for 30 minutes to 1 hour with a resultant improvement of the crystallinity of the ferroelectric thin film 24.

Figure 4D:
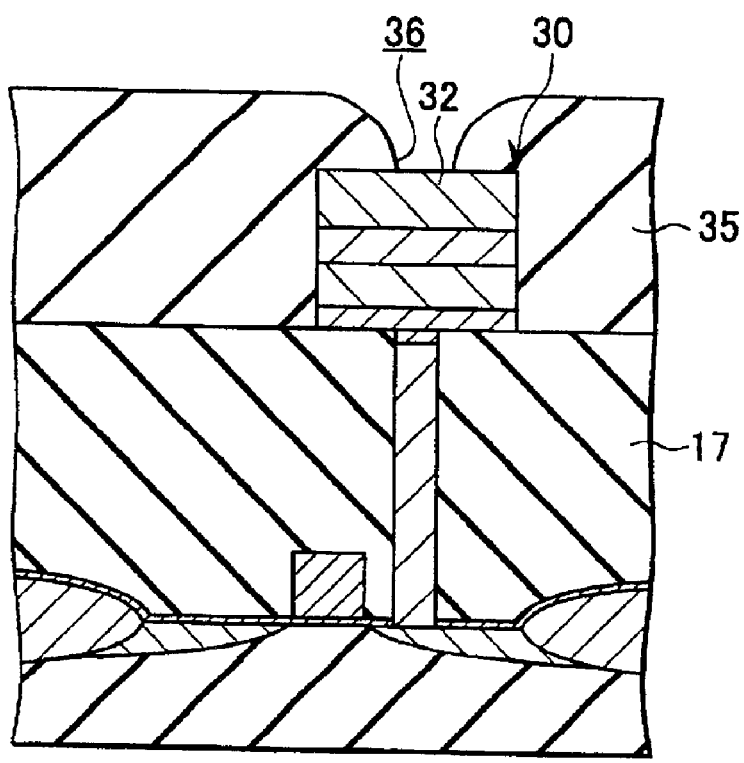

Referring next to FIG. 4D, CVD is used to form the second interlayer insulating film 35 on the first interlayer insulating film 17 through the deposition of a silicon oxide film with a thickness of 200 nm, for example, in the manner of covering the aforementioned capacitor 30. The substrate temperature in forming film for the second interlayer insulating film 35 is set at 400° C., for example.

After the subsequent formation of a photoresist film (not shown) by the coating technique on the second interlayer insulating film 35, an opening pattern to form a connection aperture extending to the upper electrode 32 of the capacitor 30 is formed by the lithographic process (exposure, development, baking, etc.), followed by a dry etching process of the interlayer insulating film 35 with the patterned photoresist film as the mask to form a connection aperture 36 which extends to the upper electrode 32. The stripping of the photoresist film follows.

Figure 4E:
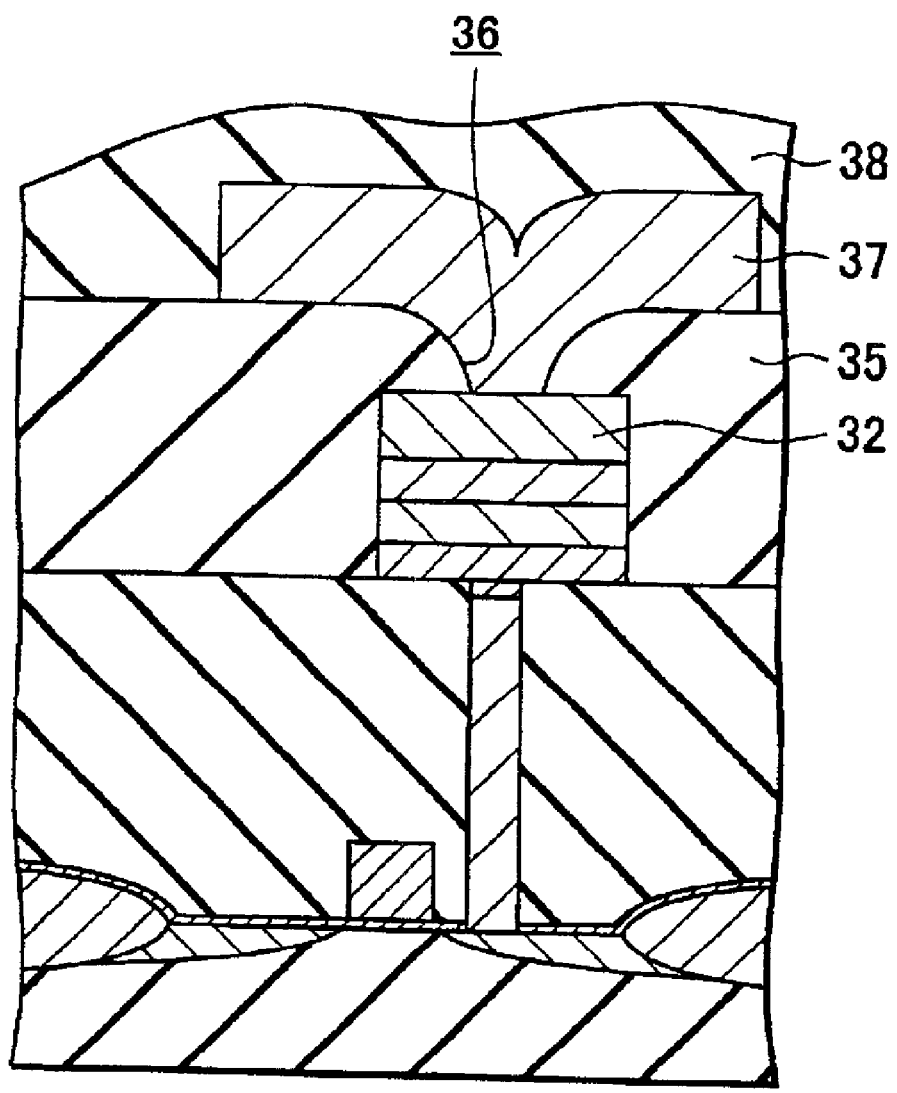

As illustrated in FIG. 4E, after a wiring metal film is formed on the second interlayer insulating film 35 in the manner of embedding the connection aperture 36 by depositing aluminum or aluminum alloy, for example, the wiring metal film is subjected to patterning to form the wiring 37 connecting the connection aperture 36 with the upper electrode 32.

The protective film 38 covering the wiring 37 on the second interlayer insulating film 35 is next formed of such an insulating film containing a silicon nitride film. There follows a step, not illustrated, of coating a photoresist, which is subjected to patterning by the lithographic process (exposure, development, baking, etc.) in the shape of a pad to take out wiring, whereupon this photoresist pattern is used as the mask to perform dry etching of the protective film 38, thus forming the pad (not shown).

In the nonvolatile semiconductor storage device, the use of a complex capacitor structure designed to minimize any change of the coercive electric field in the operational guaranteed temperature contributes to reducing the design margin of a nonvolatile storage element of high integration density, thus realizing a ferroelectric, nonvolatile storage device of high integration density.

Third Embodiment

Now, referring to a schematic section of FIG. 5, another modified nonvolatile semiconductor storage device according to a third embodiment will be described with an explanation of a nonvolatile semiconductor storage device employing a complex capacitor structure.

Figure 5:
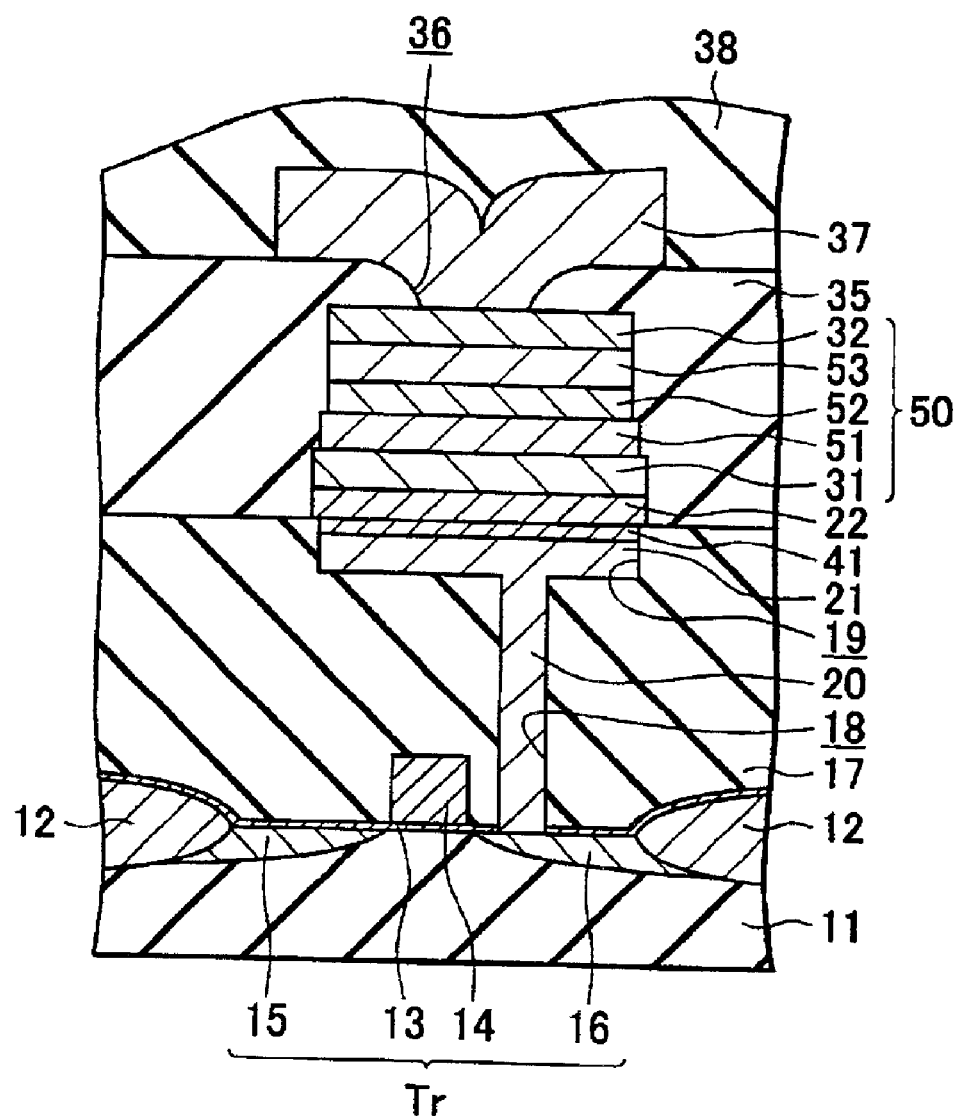
FIG. 5 shows schematically a section of a third preferred embodiment of a nonvolatile semiconductor storage device according to this invention.

As depicted in FIG. 5, an element isolation oxide film 12 separating the element forming region is formed on a semiconductor substrate 11 (e.g., p-type silicon substrate). In the element forming region of the semiconductor substrate 11 is formed a gate insulating film 13 comprised of a silicon oxide film of 1.5 nm thick, for example, and a silicon nitride film of 2 nm thick, for example.

A gate electrode 14 is formed on the gate insulating film 13, and a source region 15 is formed on one side of the gate electrode 14 on the semiconductor substrate 11, while a drain region 16 is formed on the other side thereof on the semiconductor substrate 11. A transistor Tr is constructed in this manner.

On the semiconductor substrate 11 is formed a first interlayer insulating film 17 covering the transistor Tr through the deposition and formation of, for example, a silicon oxide film having a thickness of 700 nm. A contact hole 18 extending to the drain region 16 and a connection pattern groove 19 stretching out continuously to the contact hole 18 are formed in this first interlayer insulating film 17, a plug 20 comprised of polysilicon being formed inside the contact hole 18 and a conductive pattern 21 comprised of polysilicon being formed inside the connection pattern groove 19. As shown in the figure, a silicide layer 41 may be formed on top of the conductive pattern 21.

On the semiconductor substrate 11, there is formed a barrier layer 22 connecting with the conductive pattern 21. This barrier layer 22 comprises, as an example, a titanium (Ti) film fully grown to a thickness of 20 nm with a titanium nitride (TiN) thin film fully grown to a thickness of 50 nm formed thereon. In addition, a lower electrode 31 comprised of a platinum thin film having a thickness of 200 nm, for example, is formed on the barrier layer 22.

On the lower electrode 31, there are formed, sequentially from the bottom layer up, a ferroelectric thin film 51 comprising an SBT thin film of a thickness of 60 nm to 120 nm, for example, an electrode thin film 52 comprising an iridium thin film, a dielectric thin film 53 comprising a PNN thin film, and an upper electrode 32 comprising an iridium thin film. As the foregoing explanation shows, a complex capacitor 50 is comprised of the lower electrode 31, the ferroelectric thin film 51, the dielectric thin film 53, and the upper electrode 32.

The ferroelectric thin film 51 is available as PZT expressed by $Pb(Zr_xTi_{1-x})O_3$ (where $0.1 \leq x \leq 0.8$), or PZT added with La or Nb, or PZT part of Pb of which or part of (Zr, Ti) of which is substituted by Nb. Also, $Sr_{1-x}Bi_{2+x}Ta_2O_9$ (where $0.01 \leq x \leq 0.3$), $Sr_{1-x}Bi_{2+x}Nb_2O_9$ (where $0.01 \leq x \leq 0.3$), and $Sr_{1-x}Bi_{2+x}(Ta_2Nb_y)O_9$ (where $0.01 \leq x \leq 0.3$, $0.1 \leq y \leq 0.5$) are available.

Certain metals or conductive metal oxides are available for the electrode thin film 52, for example, one kind from iridium, platinum, and palladium, or an alloy or a layer-structure substance composed of at least two kinds of iridium, platinum, and palladium, or conductive oxides possessing metal conduction such as iridium oxide ($IrO_2$), ruthenium strontium oxide ($SrRuO_3$), and iridium strontium oxide ($SrIrO_3$), or a layer-structure substance of a metal film and an oxide film.

As far as the dielectric thin film 53 is concerned, it should comprise such a dielectric thin film as to have a temperature dependency, in which the dielectric constant decreases accompanying a temperature increase in the operational guaranteed temperature range of the nonvolatile semiconductor storage device, further comprising a relaxation type ferroelectric thin film. For the relaxation type ferroelectric thin film, there are available such metal oxides as $Pb(M_{1/3}Nb_{2/3})O_3$ (where M=Co, Ni, Mg), $Pb(M_{1/3}Ta_{2/3})O_3$ (where M=Co, Ni, Mg), and $Pb(Fe_{2/3}W_{1/3})O_3$, in which position B of a ferroelectric having the Perovskite structure ($ABO_3$) comprises a mixture of two elements.

Moreover, a second interlayer insulating film 35 is formed through the deposition of a silicon oxide film with a thickness of 200 nm, for example, in the manner of covering the complex capacitor 50. On this second interlayer insulating film 35 is formed a connection aperture 36 extending to the upper electrode 32. On the second interlayer insulating film 35 is formed a wiring 37 made of, for example, aluminum or an aluminum alloy connecting with the upper electrode 32 via the connection aperture 36. On the interlayer insulating film 35 is formed a protective film 38 covering the wiring 37, and a pad (not shown) is formed on the protective film 38.

The capacitor is specially designed in the nonvolatile semiconductor storage device described in relation to the aforementioned third embodiment, in that a complex capacitor structure is employed therefor, thus decreasing the margin of design associated with the coercive electric field and realizing a ferroelectric nonvolatile storage device of high integration density.

Construction of the complex capacitor is based on, for example, a ferroelectric capacitor serially connected with a capacitor (compensation capacitor) using a dielectric thin film with such a temperature dependency that the dielectric constant thereof tends to decrease accompanying an increase in the material temperature.

As the foregoing explanation of the third embodiment shows, connection between the ferroelectric capacitor and the compensation capacitor is so arranged to ensure that the electrode thin film 52 functions as both the electrode of the ferroelectric capacitor and that of the compensation capacitor, while another construction may be used, in which a different conductive material from that of the capacitor electrode is used for connection between the electrode of the ferroelectric capacitor and that of the compensation capacitor.

In the complex capacitor, compensation for the temperature dependency of the coercive electric field is rendered by decreasing the voltage to be applied to the ferroelectric capacitor accompanying the increase in the capacitor temperature. For materials of compensation capacitors that can compensate for the temperature dependency of the coercive electric field, there are available, for instance, $Pb(M_{1/3}Nb_{2/3})O_3$ (where M=Co, Ni, Mg), $Pb(M_{1/3}Ta_{2/3})O_3$ (where M=Co, Ni, Mg), and $Pb(Fe_{2/3}W_{1/3})O_3$ wherein a position B of a ferroelectric having the Perovskite structure ($ABO_3$) is composed of a mixture of two kinds of elements. In these substances, the phase change from normal dielectric phase to ferroelectric phase occurs in the vicinity of 180K to 80K, which is sufficiently lower than the operational guaranteed temperature (e.g., −40° C.) of the device, and at the device guaranteed temperature, they have no spontaneous polarization, showing characteristics as the dielectrics of high dielectric constants.

Moreover, the voltage applied to the complex capacitor is distributed to the ferroelectric capacitor and the compensation capacitor. The voltage thus distributed to the compensation capacitor is determined in terms of a balance between the effective performance of compensation and suppression of the operating voltage of the device through distribution of no excessive voltage.

Take, for instance, a case of using an SBT thin film for the ferroelectric capacitor. If the compensation capacitor should take the same shape as that of the ferroelectric capacitor, a dielectric constant of approx. 500 or more is necessary for the voltage associated with the compensation capacitor to be about 0.5 times that of the SBT. Also, suppose that a PZT thin film is employed for the ferroelectric capacitor. Then, it would be desirable to use a substance having an even higher dielectric constant for the thin film material of the compensation capacitor.

When diverse conditions as described above are taken into consideration, the preferable dielectric substances for the compensation capacitor materials are Pb $(Ni_{1/3}Nb_{2/3})O_3$ and Pb $(Co_{1/3}Nb_{2/3})O_3$.

Moreover, in the aforementioned third preferred embodiment, although the electrode thin film 52 is formed between the ferroelectric thin film 51 and the dielectric thin film 53, another acceptable construction may be to layer the dielectric thin film 53 directly over the ferroelectric thin film 51 without any formation of the electrode thin film 52. Such construction including no electrode thin film 52 means that there is a layer structure of a dielectric thin film (the dielectric thin film 53) having a temperature dependency, in which the dielectric constant decreases accompanying the temperature increase in the operational guaranteed temperature range of the nonvolatile semiconductor storage device, and a ferroelectric thin film (the ferroelectric thin film 51) showing a ferroelectric property in the operational guaranteed temperature range, this layered film thus turning into a thin film exhibiting a ferroelectric property. It should be noted that a construction in which the ferroelectric thin film 51 is formed at a bottom layer with the dielectric thin film 53 formed on a top layer may be used as well.

Next, a method of fabricating the nonvolatile semiconductor storage device described in the third preferred embodiment will be explained with reference to the sectional views of the fabrication process from FIG. 6A to FIG. 6D.

Figure 6A:
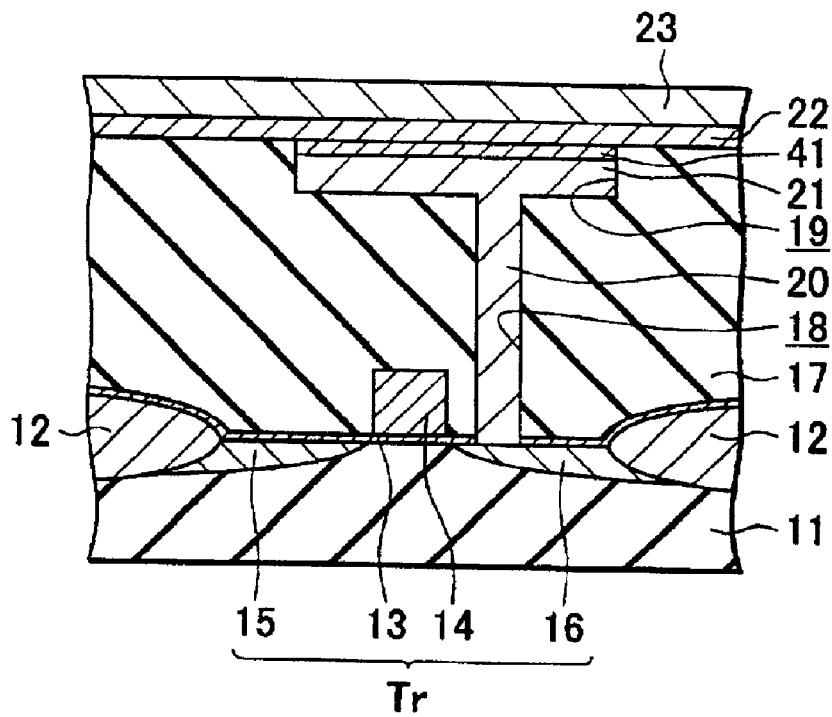
FIGS. 6A to 6D are cross-sectional views of a fabrication process illustrating a fabrication method of a nonvolatile semiconductor storage device described in a third preferred embodiment.

As FIG. 6A shows, after the element isolation oxide film 12 is formed on the semiconductor substrate 11 (e.g., p-type silicon substrate) by the selective oxidation process, the semiconductor substrate 11 is heated to 800° C. and subjected to exposure to oxygen gas diluted with nitrogen gas, a silicon oxide film of 1.5 nm thick, for example, is formed on the exposed surface thereof. Furthermore, reduced pressure CVD is used to form a silicon nitride of 2 nm thick, for example, for use as the gate insulating film 13.

The succeeding processing step includes the formation of an electrode forming film by producing a gate electrode thin film and a titanium nitride thin film. This is followed by the formation of a photoresist film (not shown) by the coating technique. Then, the photoresist film is subjected to patterning into the shape of a gate electrode pattern by the lithographic process (exposure, development, baking, etc.). Next, the patterned photoresist film is put to use as a mask for etching the aforementioned electrode forming film to form the gate electrode 14. Then, impurity (e.g., arsenic) is introduced into the semiconductor substrate 11 by ion implantation using the photoresist film and the element isolation oxide film 12 as the masks to form the source region 15 and the drain region 16. Then the photoresist film is stripped.

Thereafter, a silicon oxide film of 700 nm thick, for example, is deposited by CVD on the semiconductor substrate 11 to form the first interlayer insulating film 17. The substrate temperature in producing film for the first interlayer insulating film 17 is set at 400° C., for example. This is followed by the formation of the contact hole 18 which exposes the drain region 16 and the connection pattern groove 19 which stretches out continuously to the contact hole 18.

Moreover, after the deposition of polysilicon of a thickness of 600 nm, for example, in the manner of embedding it inside the contact hole 18 and the connection pattern groove 19, the heat treatment takes over in nitrogen at 850° C. for 30 minutes, for example. Then, an excess polysilicon film on the first interlayer insulating film 17 is removed, e.g., by CMP (Chemical Mechanical Polishing).

The plug 20 is formed inside the contact hole 18 and the conductive pattern 21 is formed inside the connection pattern groove 19 as well. It should be noted that, as shown in the figure, to improve the conductivity of the conductive pattern 21, silicide processing may be applied to the top of the conductive pattern 21 to form the silicide layer 41 there.

The subsequent step includes rinsing of the semiconductor substrate 11, which is then heated or exposed to a reduced pressure atmosphere to perform dehydration, whereupon a process such as sputtering succeeds to make a titanium (Ti) thin film (not shown) of 20 nm thick, for example, then a titanium nitride (TiN) thin film of 50 nm thick, for example, thereby forming the barrier layer 22. In addition, the lower electrode thin film 23 comprised of a platinum (Pt) film is made to have a thickness of 200 nm, for example.

As an example of the foregoing film making conditions of each film, the substrate temperature may be set at 200° C. when making a titanium (Ti) thin film, 25° C. when making a titanium nitride (TiN) thin film, or 400° C. when making a platinum thin film, and the pressure of film-making atmosphere in any of these cases may be set at 0.53 Pa with DC power at 2 kW. Each of the films mentioned above is heat-treated for 1 hour in a nitrogen atmosphere at 400° C. to 700° C., as necessary, to form the stable lower electrode thin film 23.

Figure 6B:
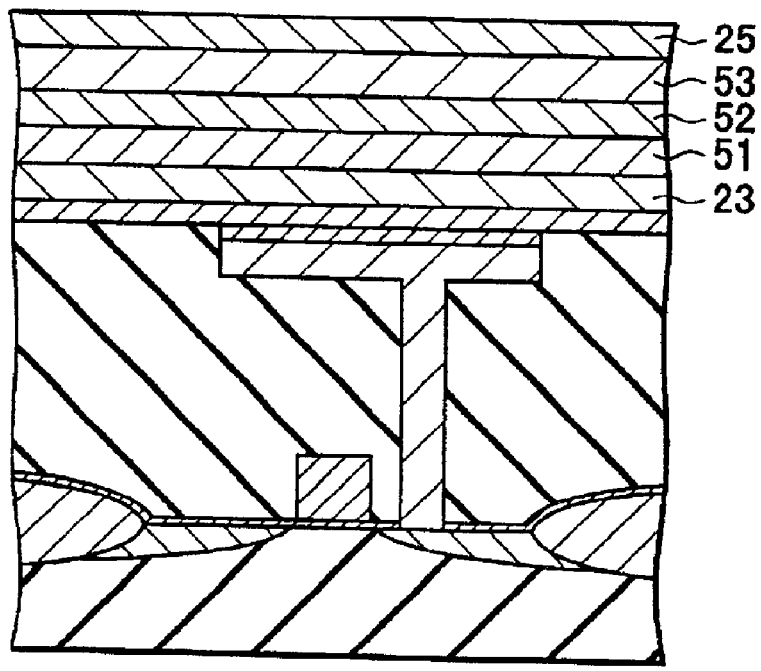

As illustrated in FIG. 6B, the rotary coating method follows to produce a precursor thin film of SBT, that is, $Sr_{0.8}Bi_{2.2}Ta_2O_9$ (SBT) having excess of Bi and Sr deficiency. First, the elements of Sr, Bi, and Ta are compared to the stoichiometric composition of the SBT. On the aforementioned semiconductor substrate 11 which was treated with the process of forming a lower electrode thin film 23 thereon, a series of processing steps of coating a solution of organic metals containing a 0.0% to 5% excess of Bi, drying, and rapid thermal annealing are performed one time or several times, and, the crystallization process of the formed precursor thin film in an oxidative or neutral atmosphere is performed at the specified temperature between 500° C. and 750° C., resulting in the formation of a ferroelectric thin film 51 comprising an SBT thin film of a thickness of 60 nm to 120 nm.

Next, sputtering is applied to form the electrode thin film 52 comprised of an iridium thin film on the ferroelectric thin film 51. A good example of film-making conditions of this iridium thin film includes the specified temperature between 25° C. and 400° C. for the substrate temperature, a setting of 0.53 Pa argon atmosphere for film-making atmosphere, and a setting of 2 kW for DC power. The heat treatment may be performed, as necessary, in nitrogen atmosphere or a mixed atmosphere of oxygen and nitrogen at 550° C. to 700° C. for 30 minutes to 1 hour, thereby improving the crystallinity of the electrode thin film 52 comprised of the ferroelectric thin film 51 and the iridium thin film.

The rotary coating method succeeds to produce a precursor thin film of Pb $(Ni_{1/3}Nb_{2/3})O_3$ (PNN). First, the elements of Pb, Ni, and Nb are compared to the stoichiometric composition of the PNN. On the aforementioned semiconductor substrate 11 which was treated with the step of forming the lower electrode thin film 52 thereon, a series of processing steps of coating a solution of organic metals containing a 3% to 15% excess of Pb, drying, and rapid thermal annealing (RTA) are performed one time or several times, and, crystallization processing of the formed precursor thin film in an oxidized or neutral atmosphere is conducted at the specified temperature between 500° C. and 750° C., resulting in the formation of a ferroelectric thin film 53 comprising a PNN thin film.

Thereafter, sputtering is performed for forming an upper electrode thin film 25 comprising an iridium thin film on the above-mentioned ferroelectric thin film 53. As an example of film-making conditions of this iridium thin film, the specified temperature between 25° C. and 400° C. may be set for the substrate temperature, 0.53 Pa argon atmosphere may be set for film-making atmosphere, and 2 kW may be set for DC power. The heat treatment may be conducted, as necessary, in nitrogen atmosphere at 450° C. to 700° C. for 1 hour, with the result that the crystallinity of the dielectric thin films 51 and 53 (SBT thin film and PNN thin film) and the electrode thin film 52 is improved.

Figure 6C:
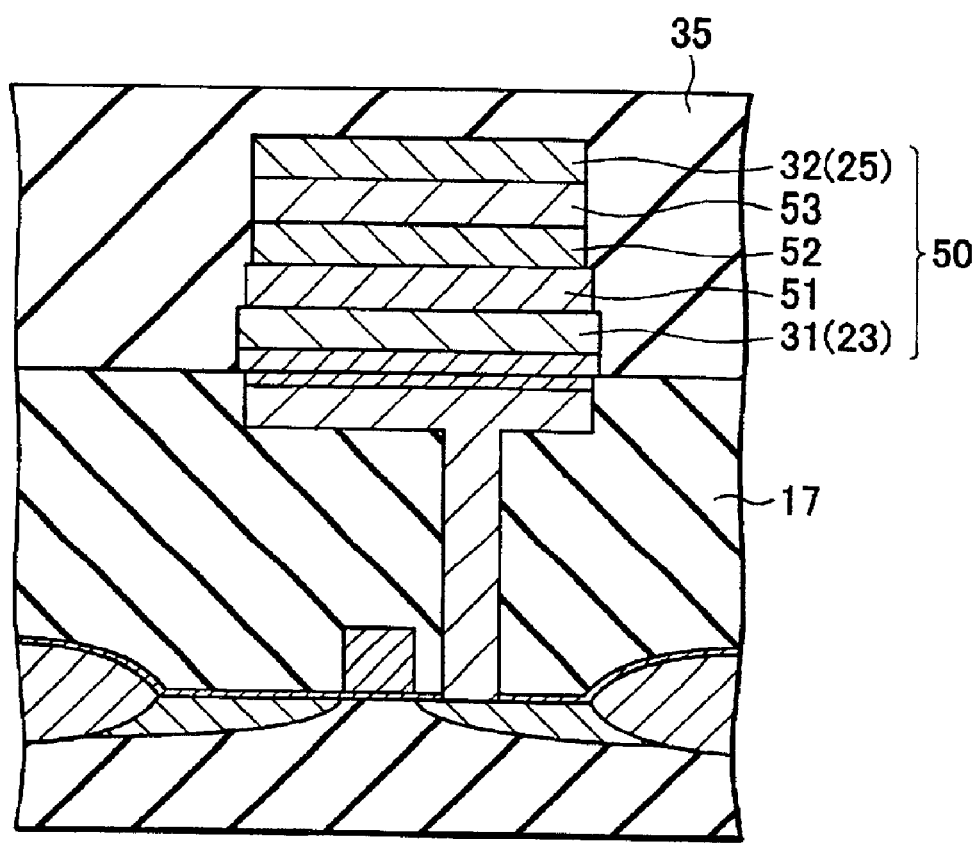

Now, referring to FIG. 6C, after a photoresist film (not shown) is formed on the upper electrode thin film 25 by the coating technique, the photoresist film is subjected to patterning into the shape of a capacitor pattern by the lithographic process (exposure, development, baking, etc.). Next, the patterned photoresist film is employed as a mask for etching from the aforementioned upper electrode thin film 25 to the barrier layer 22 thus to form the complex capacitor comprising the lower electrode 31, which is comprised of the lower electrode thin film 23, and the upper electrode 32, which is comprised of the ferroelectric thin film 51, the electrode thin film 52, the dielectric thin film 53, and the upper electrode thin film 25. The stripping process of the photoresist film then takes over.

It should be noted that a hard mask may be employed instead of the photoresist film. After the removal of the mask film, as necessary, the heat treatment may be conducted in nitrogen atmosphere or a mixed atmosphere of oxygen and nitrogen at 450° C. to 700° C. for 30 minutes to 1 hour, thereby improving the crystallinity of the SBT thin film and the PNN thin film.

Thereafter, CVD is used to form a second interlayer insulating film 35 on the first interlayer insulating film 17 through the deposition of a silicon oxide film of 200 nm thick, for example, in the manner of covering the complex capacitor 50 mentioned above. The substrate temperature at the time of film making for the second interlayer insulating film 35 is set at, e.g., 400° C., for example.

Figure 6D:
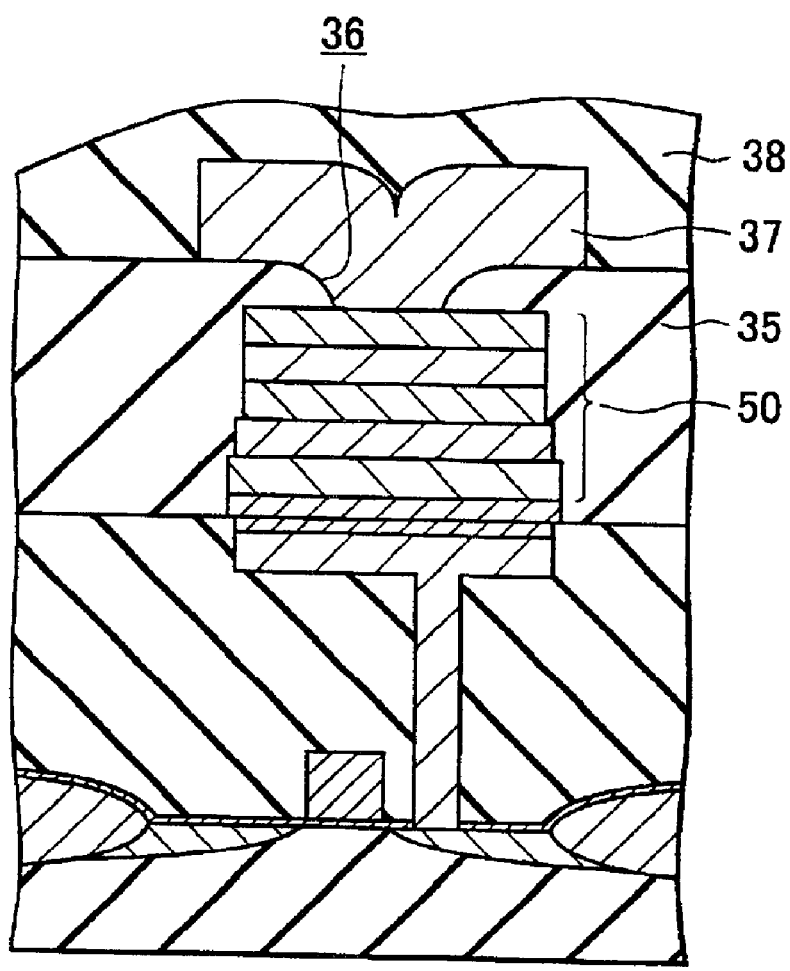

As FIG. 6D shows, a photoresist film (not shown) is next formed by the coating technique on the second interlayer insulating film 35, followed by the process of forming an opening pattern to form a connection aperture extending to the upper electrode 32 of the complex capacitor 50 by means of the lithographic process (exposure, development, baking, etc.). There succeeds the dry etching step of the interlayer insulating film 35 using the patterned photoresist film as the mask to form a connection aperture 36 extending to the upper electrode 32. The photoresist film is next removed.

After a wiring metal film is formed on the second interlayer insulating film 35 in the manner of embedding the connection aperture 36 by depositing aluminum or aluminum alloy, for example, the wiring metal film is subjected to patterning to form the wiring 37 connecting the connection aperture 36 with the upper electrode 32.

The protective film 38 covering the wiring 37 on the second interlayer insulating film 35 is next formed of such an insulating film containing a silicon nitride film. There follows a step, not illustrated, of coating a photoresist, which is then subjected to patterning by the lithographic process (exposure, development, baking, etc.) in the shape of a pad to take out wiring. Thereafter, this photoresist pattern is used as the mask to perform dry etching of the protective film 38. In this manner, the pad (not shown) is formed.

In the aforementioned third embodiment, the electrode thin film 52 is formed between the ferroelectric thin film 51 and the dielectric thin film 53. It should be noted that the dielectric thin film 53 may be directly layered on top of the ferroelectric thin film 51 without undergoing the process of forming the electrode thin film 52 therebetween. This arrangement is tantamount to a lamination of two films, namely, the dielectric thin film (dielectric thin film 53) having a temperature dependency that decreases accompanying the temperature increase in the operational guaranteed temperature range of the nonvolatile semiconductor storage device and the ferroelectric thin film (ferroelectric thin film 51) exhibiting a ferroelectric property in the operational guaranteed temperature range, and thus, this layered film becomes a thin film endowed with a ferroelectric property. It should be pointed out that a reverse arrangement may be put to use, wherein the bottom layer may be formed of the dielectric thin film 53, the top layer being formed of the ferroelectric thin film 51.

Another advantage of the nonvolatile semiconductor storage device according to the present invention is the availability of many choices for materials of thin films. The following materials may be used for the upper electrode thin film, the lower electrode thin film, the electrode thin film for capacitor connection, etc. described in each of the aforementioned preferred embodiments: one kind of iridium, platinum, or palladium; an alloy or a layer-structure film composed of at least two kinds of iridium, platinum or palladium; an oxide conductor showing metallic conduction such as iridium oxide ($IrO_2$), ruthenium strontium oxide ($SrRuO_3$), and iridium strontium oxide ($SrIrO_3$); or a layer-structure substance comprised of a metal film and an oxide film. The processes for making films of such materials are feasible if the target quality of the material and the film-making conditions are modified accordingly. It should also be noted that the preceding modifications require corresponding changes in the heat-treatment conditions.

An equally important advantage of the nonvolatile semiconductor storage device according to the present invention lies in a fact that the combinations of the compensation capacitor and the ferroelectric capacitor thin film are not confined to the combinations introduced to the preferred embodiments mentioned above. For instance, the film-making order of the compensation capacitor and the ferroelectric capacitor thin film may be in reverse to that of the foregoing preferred embodiments. This order is determined according to the low or high degree of the heat-treating temperature applied to each film or the drive method of a device.

The scope of the invention is shown by appended claims, and all changes and modifications that fall within the meaning of these claims are contained in this invention.

What is claimed is:

1. A nonvolatile semiconductor storage device comprising:
a complex capacitor comprised of a dielectric thin film having a temperature dependency, in which a dielectric constant of the capacitor decreases an increase in temperature in an operational temperature range of said nonvolatile semiconductor storage device, and a ferroelectric capacitor provided having a ferroelectric thin film.

2. The nonvolatile semiconductor storage device according to claim 1, wherein:
said complex capacitor comprises a complex thin film having a ferroelectric property rendered by a compounding action of the dielectric thin film having a temperature dependency wherein the dielectric constant decreases accompanying an increase in temperature in the operational temperature range of said nonvolatile semiconductor storage device, the ferroelectric thin film exhibiting the ferroelectric property in the operational temperature range, and a conductive thin film held between said dielectric thin film and said ferroelectric thin film.

3. The nonvolatile semiconductor storage device according to claim 1, wherein:
said dielectric thin film has the temperature dependency in which the dielectric constant decreases accompanying an increase in temperature in the operational temperature range of said nonvolatile semiconductor storage device and further comprising a relaxation type ferroelectric thin film.

4. The nonvolatile semiconductor storage device according to claim 2, wherein:
said dielectric thin film has a temperature dependency in which the dielectric constant decreases an increase in temperature in the operational temperature range of said nonvolatile semiconductor storage device.

5. The nonvolatile semiconductor storage device according to claim 3, wherein:
said relaxation type ferroelectric thin film comprises a metal oxide having a Perovskite structure.

6. The nonvolatile semiconductor storage device according to claim 4, wherein:
said relaxation type ferroelectric thin film comprises a metal oxide having a Perovskite structure.

7. The nonvolatile semiconductor storage device according to claim 1, wherein:
said ferroelectric thin film being selected from the group consisting of PZT expressed by $Pb(Zr_xTi_{1-x})O_3$ (where $0.1 \leq x \leq 0.8$), PZT added with La or Nb, and PZT part of Pb of which is substituted by La or part of (Zr, Ti) of which is substituted by Nb.

8. The nonvolatile semiconductor storage device according to claim 2, wherein:
said ferroelectric thin film comprises any one of PZT expressed by $Pb(Zr_xTi_{1-x})O_3$ (where $0.1 \leq x \leq 0.8$), PZT added with La or Nb, and PZT part of Pb of which is substituted by La or part of (Zr, Ti) of which is substituted by Nb.

9. The nonvolatile semiconductor storage device according to claim 1, wherein:
said ferroelectric thin film comprises any one of $Sr_{1-x}Bi_{2+x}Ta_2O_9$ (where $0.01 \leq x \leq 0.3$), $Sr_{1-x}Bi_{2+x}Nb_2O_9$ (where $0.01 \leq x \leq 0.3$) and $Sr_{1-x}Bi_{2+x}(Ta_{1-y}Nb_y)O_9$ (where $0.01 \leq x \leq 0.3$, $0.1 \leq y \leq 0.5$).

10. The nonvolatile semiconductor storage device according to claim 2, wherein:
said ferroelectric thin film comprises any one of $Sr_{1-x}Bi_{2+x}Ta_2O_9$ (where $0.01 \leq x \leq 0.3$), $Sr_{1-x}Bi_{2+x}Nb_2O_9$ (where $0.01 \leq x \leq 0.3$) and $Sr_{1-x}Bi_{2+x}(Ta_{1-y}Nb_y)O_9$ (where $0.01 \leq x \leq 0.3$, $0.1 \leq y \leq 0.5$).

11. The nonvolatile semiconductor storage device according to claim 1, wherein:
connection between said dielectric capacitor and said ferroelectric capacitor of said complex capacitor is made with any one of a metal and a conductive metal oxide.

* * * * *